United States Patent
Chuang et al.

(10) Patent No.: US 11,837,568 B2
(45) Date of Patent: Dec. 5, 2023

(54) BONDING STRUCTURES AND METHODS FOR FORMING THE SAME

(71) Applicant: AG MATERIALS TECHNOLOGY CO., LTD., Hsinchu (TW)

(72) Inventors: Tung-Han Chuang, Hsinchu (TW); Hsing-Hua Tsai, Hsinchu (TW)

(73) Assignee: AG MATERIALS TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 17/460,153

(22) Filed: Aug. 27, 2021

(65) Prior Publication Data
US 2022/0344298 A1    Oct. 27, 2022

(30) Foreign Application Priority Data
Apr. 23, 2021  (TW) .................................. 110114626

(51) Int. Cl.
H01L 23/00 (2006.01)

(52) U.S. Cl.
CPC .............. *H01L 24/29* (2013.01); *H01L 24/27* (2013.01); *H01L 24/32* (2013.01); *H01L 24/83* (2013.01); *H01L 2224/2745* (2013.01); *H01L 2224/29007* (2013.01); *H01L 2224/29139* (2013.01); *H01L 2224/29541* (2013.01); *H01L 2224/29582* (2013.01); *H01L 2224/29666* (2013.01); *H01L 2224/29671* (2013.01); *H01L 2224/29684* (2013.01); *H01L 2224/32147* (2013.01); *H01L 2224/8383* (2013.01); *H01L 2224/83895* (2013.01); *H01L 2924/35121* (2013.01)

(58) Field of Classification Search
CPC . H01L 2224/29582; H01L 2224/29139; H01L 2224/32147
See application file for complete search history.

(56) References Cited

U.S. PATENT DOCUMENTS

| | | | |
|---|---|---|---|
| 11,242,619 B2* | 2/2022 | Bai | H01L 21/2885 |
| 2014/0294651 A1* | 10/2014 | Roy | B22F 3/14 |
| | | | 419/33 |
| 2018/0308820 A1* | 10/2018 | Joshi | H01L 24/32 |

FOREIGN PATENT DOCUMENTS

| | | |
|---|---|---|
| CN | 110164782 A | 8/2019 |
| TW | 201542888 A | 11/2015 |
| TW | 201729306 A | 8/2017 |
| TW | 1703226 | 9/2020 |
| WO | WO 2017/201986 A1 | 11/2017 |

OTHER PUBLICATIONS

Taiwanese Patent Office, Office Action, Patent Application Serial No. 110114626, dated Aug. 24, 2021, Taiwan.

* cited by examiner

*Primary Examiner* — Dale E Page
*Assistant Examiner* — Wilner Jean Baptiste

(57) ABSTRACT

A bonding structure is provided, wherein the bonding structure includes a first substrate, a second substrate, a first adhesive layer, a second adhesive layer, and a silver feature. The second substrate is disposed opposite to the first substrate. The first adhesive layer is disposed on the first substrate. The second adhesive layer is disposed on the second substrate and opposite the first adhesive layer. The silver feature is disposed between the first adhesive layer and the second adhesive layer. The silver feature includes a silver nano-twinned structure that includes twin boundaries that are arranged in parallel. The parallel-arranged twin boundaries include 90% or more [111] crystal orientation.

10 Claims, 11 Drawing Sheets

BONDING STRUCTURES AND METHODS FOR FORMING THE SAME

CROSS-REFERENCE TO RELATED APPLICATIONS

The present application claims priority of Taiwan Application No. 110114626, filed on Apr. 23, 2021, which is incorporated by reference herein in its entirety.

BACKGROUND

Technical Field

The disclosure relates to bonding structures and methods for forming the same, and more particularly to bonding structures having silver features and methods for forming the same.

Description of the Related Art

Conventional direct bonding technologies or solid state diffusion bonding technologies require heating a material to a temperature above half of the absolute melting point ($0.5T_m$) of the material, and require applying a pressure greater than 100 MPa.

Nano-twinned films have a (111) crystal orientation with a high diffusion rate, which allows bonding processes to be performed at a lower temperature than that required by conventional direct bonding or solid-state diffusion bonding techniques. Nano-twinned films have been applied in wafer-to-wafer and wafer-to-substrate bonding Taiwan Patent No. 16865724 discloses an electrical connection mechanism and method for electroplating copper nano-twinned films, in which two oxide substrates covered by metal layers are bonded at a pressure of 0.8 MPa to 3 MPa and a temperature of 200° C. to 350° C. Although the bonding process can be performed at the low pressure of 0.8 MPa to 3 MPa in the prior art, it is necessary to perform chemical mechanical polishing (CMP) on the nano-twinned film before bonding to reduce the surface roughness. It not only complicates the process but also has the potential to damage the nano-twinned film. Taiwan Patent No. 1521104 discloses a package structure and method, which involves first electroplating copper seed layers on two substrates and then electroplating nickel nano-twinned films on the copper seed layers, and then bonding the two substrates. Taiwan Patent No. 1519681 discloses a structure and method, which involves electroplating gold nano-twinned films on surfaces of semiconductor wafers, circuit boards or conductive substrates, and then bonding them to each other.

However, the conventional technique uses a high-speed rotary electroplating method at a speed of 50 rpm or even 1500 rpm, which makes it difficult to control the process and film quality. The resulting distance between parallel-arranged twin boundaries is large, and it includes less than 90% [111] crystal orientation. The XRD pattern in Taiwan Patent No. 1432613 shows that the crystal orientation of Cu is still obvious at (222). The XRD pattern in Taiwan Patent No. 1507548 shows that the crystal orientation of Au is still obvious at (222). In addition, it includes only 50% [111] crystal orientation.

Furthermore, the size of the components or contacts formed through the electroplating process may be limited. In particular, components or contacts smaller than 2 μm generally cannot be produced through an electroplating process. The waste produced by the electroplating process also has environmental concerns. The conventional technique described above utilizes the nano-twinned film to bond the semiconductor wafers, circuit boards or conductive substrates. Since the surface of the nano-twinned film is not smooth enough, it is necessary to perform chemical mechanical polishing (CMP) on the surface of the nano-twinned film before bonding process to reduce the surface roughness. This not only complicates the process but also has the potential to damage the nano-twinned film. In addition, as the nano-twinned film is directly plated on the silicon substrate, the bonding force between the silicon substrate and the nano-twinned film is weak, which may also cause peeling and further decrease the reliability. In view of the various disadvantages of the conventional techniques, the semiconductor industry still faces challenges in wafer bonding techniques.

SUMMARY

Some embodiments of the present disclosure provide a bonding structure, including: a first substrate; a second substrate disposed opposite to the first substrate; a first adhesive layer disposed on the first substrate; a second adhesive layer disposed on the second substrate and opposite to the first adhesive layer; and a silver feature disposed between the first adhesive layer and the second adhesive layer. The silver feature includes a silver nano-twinned structure including parallel-arranged twin boundaries. The parallel-arranged twin boundaries include 90% or more [111] crystal orientation.

In some embodiments, the first adhesive layer and the second adhesive layer are respectively disposed on entire surfaces of the first substrate and the second substrate, and wherein the silver feature is a silver film.

In some embodiments, the first adhesive layer and the second adhesive layer are respectively disposed on partial surfaces of the first substrate and the second substrate, and wherein the silver feature is a silver pillar and the sidewalls of the silver pillar are aligned with the sidewalls of the first and second adhesive layers.

In some embodiments, at least 80% of the silver feature is the silver nano-twinned structure.

In some embodiments, the thickness of the silver feature is at least 3.0 μm.

In some embodiments, the thickness of the silver nano-twinned structure is at least 2.0 μm.

In some embodiments, the distance between the parallel-arranged twin boundaries is between 1 nm and 100 nm.

In some embodiments, the thickness of each of the first adhesive layer and the second adhesive layer is 0.01 μm to 0.1 μm.

In some embodiments, each of the first adhesive layer and the second adhesive layer comprises titanium (Ti), chromium (Cr), titanium tungsten (TiW) or a combination thereof.

In some embodiments, each of the first substrate and the second substrate comprises Si wafer, SiC wafer, GaAs wafer, GaN wafer or a combination thereof.

Some embodiments further include a transition grain layer between the first adhesive layer and the silver feature and/or between the second adhesive layer and the silver feature.

Further embodiments of the present disclosure provide a method for forming a bonding structure, including: forming a first adhesive layer on a first substrate; forming a first silver feature on the first adhesive layer; forming a second adhesive layer on a second substrate; forming a second silver feature on the second adhesive layer; and bonding the first silver feature and the second silver feature to form a third silver feature between the first adhesive layer and the second adhesive layer, wherein the third silver feature comprises a silver nano-twinned structure comprising parallel-arranged twin boundaries, wherein the parallel-arranged twin boundaries comprise 90% or more [111] crystal orientation.

In further embodiments, the first adhesive layer and the second adhesive layer are respectively formed on entire opposite surfaces of the first substrate and the second substrate, and wherein the silver feature is a silver film.

In further embodiments, the first adhesive layer and the second adhesive layer are respectively formed on partial opposite surfaces of the first substrate and the second substrate, and wherein the silver feature is a silver pillar and the sidewalls of the silver pillar are aligned with the sidewalls of the first and second adhesive layers.

In further embodiments, at least 80% of the third silver feature is the silver nano-twinned structure, and the distance between the parallel-arranged twin boundaries is between 1 nm and 100 nm.

In further embodiments, the thickness of the third silver feature is at least 3.0 μm, and the thickness of the silver nano-twinned structure is at least 2.0 μm.

In further embodiments, each of the steps of forming the first adhesive layer, the second adhesive layer, the first silver feature and the second silver feature comprises sputtering or evaporation coating.

In further embodiments, the bonding of the first silver feature and the second silver feature is performed at a temperature between 100° C. and 250° C.

In further embodiments, the bonding of the first silver feature and the second silver feature is performed at a pressure of 5 MPa to 30 MPa.

Further embodiments include forming a transition grain layer between the first adhesive layer and the third silver feature and/or between the second adhesive layer and the third silver feature.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1A:
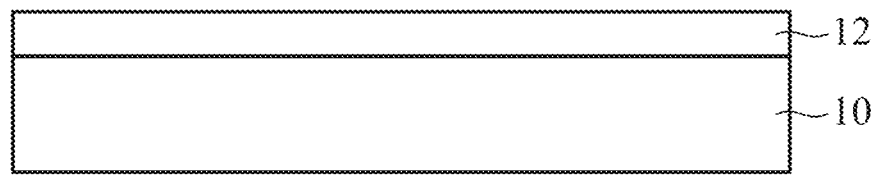
FIGS. 1A-1D are cross-sectional views of a bonding structure including a silver feature as a silver film at various fabrication stages according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Some variations of embodiments are described below. In different figures and illustrated embodiments, similar element symbols are used to indicate similar elements. It should be appreciated that additional operations can be provided before, during, and/or after the stages described in these embodiments. Some of the stages that are described can be replaced or eliminated for different embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Furthermore, when a number or a range of numbers is described with "about," "approximate," and the like, the term is intended to encompass numbers that are within a reasonable range including the number described, such as within +/− 10% of the number described or other values as understood by person skilled in the art. For example, the term "about 5 nm" encompasses the dimension range from 4.5 nm to 5.5 nm.

In addition, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

Embodiments of the present disclosure provide a bonding structure, including: two adhesive layers respectively disposed on opposite surfaces of two substrates, and a silver feature disposed between the two adhesive layers. The adhesive layer can enhance the bonding force between the substrate and the silver feature, and the adhesive layer can reduce the influence of the crystal orientation of the substrate on the silver feature. Furthermore, at least 80% of the silver feature is a silver nano-twinned structure, and the silver nano-twinned structure includes 90% or more [111] crystal orientation. In addition to the characteristics of silver itself, the characteristics of the twin structure, such as better resistance to oxidation, resistance to corrosion, electrical conductivity, thermal conductivity, and high temperature stability, etc., make the bonding structure according to the embodiments of the present disclosure more applicable in the semiconductor industry such as low-temperature and low-pressure wafer bonding and 3D-IC flip-chip assembly.

FIGS. 1A-1D illustrate cross-sectional views of a bonding structure at various fabrication stages according to some embodiments of the present disclosure. Referring to FIG. 1A, a first adhesive layer 12 is formed on the entire surface of a first substrate 10. In some embodiments, the first substrate 10 includes a semiconductor wafer. For example, the first substrate 10 includes element semiconductors, such as silicon (Si) and germanium (Ge); compound semiconductors, such as silicon carbide (SiC), gallium arsenide (GaAs), gallium phosphide (GaP), indium phosphide (InP), indium arsenide (InAs) and/or indium antimonide (InSb); alloy semiconductors, such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP) and/or gallium indium arsenide phosphide (GaInAsP); or a combination thereof.

In some embodiments, the first adhesive layer 12 may include titanium (Ti), chromium (Cr), titanium tungsten (TiW) or a combination thereof. The thickness of the first adhesive layer 12 may be 0.001 µm to 1 µm, for example, 0.1 µm to 0.5 µm. The adhesive layer can provide a better bonding force between the substrate and a silver feature subsequently formed, and has the effect of lattice buffering.

In some embodiments, the first adhesive layer 12 may be formed on the first substrate 10 through sputtering. The sputtering process may use single sputtering gun or multiple sputtering guns. In the sputtering process, the power source may be DC, DC plus, RF, or high-power impulse magnetron sputtering (HIPIMS). The process power for sputtering the first adhesive layer 12 may be, for example, about 100 W to about 200 W. The sputtering process is performed at room temperature; however, the temperature during the sputtering process may rise by about 50° C. to about 200° C. The deposition rate of the first adhesive layer 12 may be, for example, about 0.1 nm/s to about 0.3 nm/s. The background pressure of the sputtering process may be less than $1 \times 10^{-5}$ torr, and the working pressure may be, for example, about $1 \times 10^{-3}$ torr to $1 \times 10^{-2}$ torr. The flow rate of argon may be about 10 sccm to about 20 sccm. The rotation speed of the stage may be, for example, about 5 rpm to about 20 rpm. During the sputtering process, a bias voltage of about −100V to about −200V is applied to the substrate. It should be understood that the sputtering process parameters described above may be appropriately adjusted according to practical applications, and are not intended to be limited.

In other embodiments, the first adhesive layer 12 may be formed on the first substrate 10 through evaporation coating. The background pressure of the evaporation coating process may be less than $1 \times 10^{-5}$ torr, and the working pressure may be, for example, about $1 \times 10^{-4}$ torr to $5 \times 10^{-4}$ torr. The flow rate of argon may be about 2 sccm to about 10 sccm. The rotation speed of the stage may be, for example, about 5 rpm to about 20 rpm. The deposition rate of the first adhesive layer 12 may be, for example, about 0.05 nm/s to about 0.3 nm/s. It should be understood that the evaporation coating process parameters described above may be appropriately adjusted according to practical applications, and are not intended to be limited.

Figure 1B:
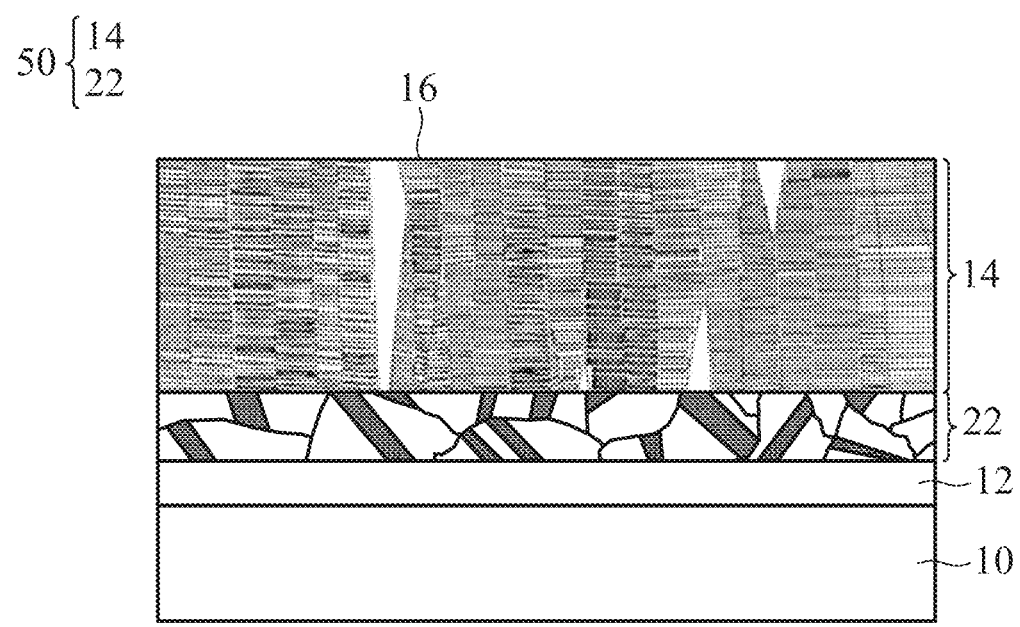

Referring to FIG. 1B, a first silver feature 50 is formed on the first adhesive layer 12. In some embodiments, the thickness of the first silver feature 50 may be 2.0 µm or more, for example, 2.0 µm to about 15 µm. The first silver feature 50 includes a silver nano-twinned structure 14. The silver nano-twinned structure 14 includes nano-scale parallel-arranged twin boundaries (Σ3+Σ9), and the distance between the nano-scale parallel-arranged twin boundaries may be, for example, 1 nm to 100 nm, preferably 2 nm to 50 nm. In some embodiments, the silver nano-twinned structure 14 includes parallel-stacked silver nano-twinned pillars 16. The diameters of the silver nano-twinned pillars 16 may be 0.1 µm to 10 µm, preferably 0.3 µm to 1.0 µm.

Still referring to FIG. 1B, in some embodiments, in addition to the silver nano-twinned structure 14, the first silver feature also includes a transition grain layer 22. When the first silver feature 50 is initially formed on the first adhesive layer 12, instead of the silver nano-twin structure 14 with parallel-arranged twin boundaries, the transitional grain layer 22 without parallel-arranged twin boundaries will be formed first. In some embodiments, the thickness of the transition grain layer 22 may be, for example, 0.1 µm to about 1 µm.

In some embodiments, the first silver feature 50 may be formed on the first adhesive layer 12 through sputtering. In some embodiments, the sputtering process may use single sputtering gun or multiple sputtering guns. In the sputtering process, the power source may be DC, DC plus, RF, or high-power impulse magnetron sputtering (HIPIMS). The process power for sputtering the first silver feature 50 may be, for example, about 100 W to about 500 W. The sputtering process is performed at room temperature; however, the temperature during the sputtering process may rise by about 50° C. to about 200° C. The background pressure of the sputtering process may be less than $1 \times 10^{-5}$ torr, and the working pressure may be, for example, about $1 \times 10^{-3}$ torr to $1 \times 10^{-2}$ torr. The flow rate of argon may be about 10 sccm to about 20 sccm. The rotation speed of the stage may be, for example, about 5 rpm to about 20 rpm. During the sputtering process, a bias voltage of about −100V to about −200V is applied to the substrate. The deposition rate of the first silver feature 50 may be, for example, about 0.5 nm/s to about 3 nm/s. It should be understood that the sputtering process parameters described above may be appropriately adjusted according to practical applications, and are not intended to be limited.

In other embodiments, the first silver feature 50 may be formed on the first adhesive layer 12 through evaporation coating. In some embodiments, the background pressure of the evaporation coating process may be less than $1 \times 10^{-5}$ torr, and the working pressure may be, for example, about $1 \times 10^{-4}$ torr to $5 \times 10^{-4}$ torr. The flow rate of argon may be about 2 sccm to about 10 sccm. The rotation speed of the stage may be, for example, about 5 rpm to about 20 rpm. The deposition rate of the first silver feature 50 may be, for example, about 1 nm/s to about 5.0 nm/s. Additionally, an ion bombardment may be applied to the silver nano-twinned structure 14 with a voltage of about 10 V to about 300 V and a current of about 0.1 A to about 1.0 A during the evaporation coating process. It should be understood that the evaporation coating process parameters described above may be appropriately adjusted according to practical applications, and are not intended to be limited.

Compared with sputtering or evaporation coating process, sizes of components or contacts formed through the electroplating process may be limited. In particular, components or contacts generally smaller than 2 μm cannot be produced through the electroplating process. In contrast, components or contacts with sizes below 2 μm can be easily manufactured by sputtering or evaporation coating process.

The adhesive layer of embodiments of the present disclosure can improve the bonding force between the metal layer subsequently formed and the substrate to avoid peeling. If a nano-twin film is sputtered directly on a substrate, the thickness of the nano-twin film may be only about 2 μm due to the insufficient bonding force between the nano-twin film and the substrate.

In addition, if a nano-twin film is formed directly on a substrate, the film may be affected by the crystal orientation of the substrate. For example, a film formed on a substrate with a (100) orientation may be difficult to form a (111) crystal orientation. Therefore, a nano-twinned film with a high twin density may only be formed on a substrate with (111) crystal orientation, while a nano-twinned film formed on a substrate with (110) crystal orientation may have a low twin density. However, according to some embodiments of the present disclosure, the adhesive layer has the lattice buffering effect on forming the twin structure on the substrate with different crystal orientation. In particular, whether the nano-twinned structures are formed on the (100), (110), or (111) substrate, all of them include greater than 90% of the [111] crystal orientation.

It should be understood that the (111) silver nano-twinned structure may be formed not only on the (100), (110), or (111) substrate, but also on other substrates, such as SiC, GaAs, or the like since the adhesive layer can reduce the influence of the crystal orientation of the substrate on the crystal orientation of the nano-twinned structure deposited subsequently.

Figure 1C:
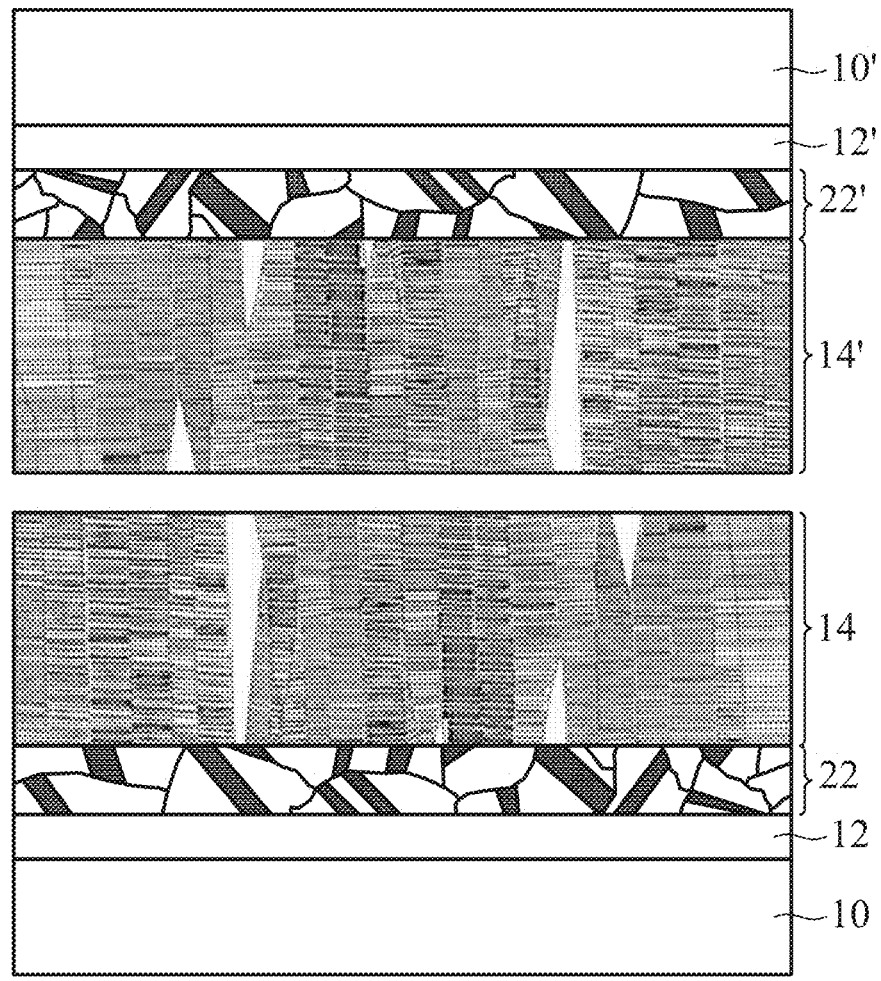

Referring to FIG. 1C, a second substrate 10' is provided, and a second adhesive layer 12' and a second silver feature 50' may be formed on the entire surface of the second substrate 10' with reference to the method described in FIGS. 1A and 1B. Subsequently, the second substrate 10' and the first substrate 10 are disposed opposite to each other for bonding.

Figure 1D:
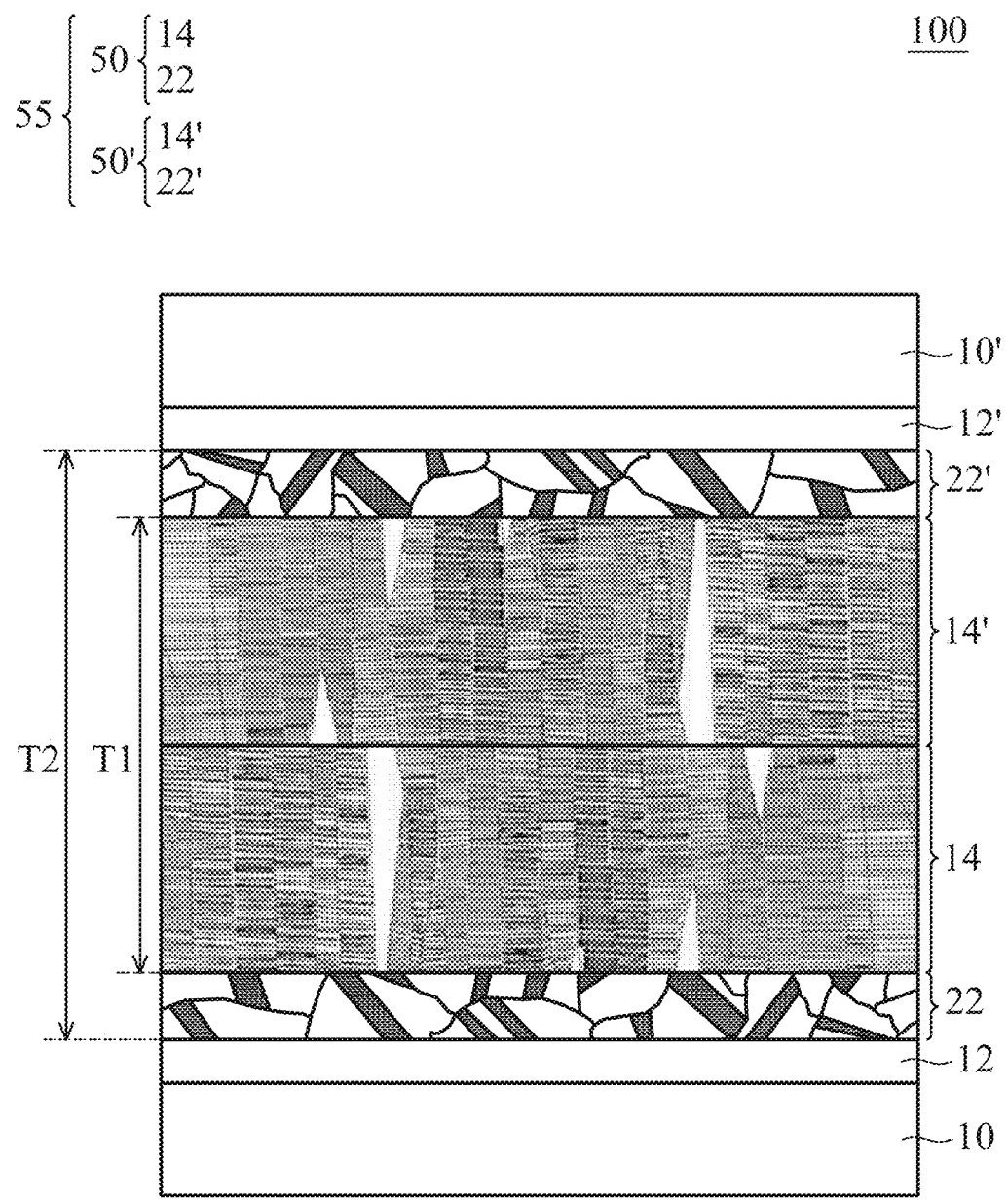

Referring to FIG. 1D, the first silver feature 50 and the second silver feature 50' are oppositely bonded to form a third silver feature 55 and a bonding structure 100. In the embodiment shown in FIG. 1D, the third silver feature 55 is a silver film covering entire opposite surfaces of the first substrate 10 and the second substrate 10'. The third silver feature 55 has parallel-arranged twin boundaries (Σ3+Σ9). In the cross-section view of the third silver feature, 40% or more of all boundaries are the parallel-arranged twin boundaries. The parallel-arranged twin boundaries include 90% or more (such as greater than 90% or greater than 95%) [111] crystal orientation, and may reach 100%. The distance between the twin boundaries may be 1 nm to 100 nm, preferably 2 nm to 50 nm. In some embodiments, at least 80% of the third silver feature 55 is the silver nano-twinned structure 14, 14'. In some embodiments, the thickness T1 of the silver nano-twinned structure 14, 14' is at least 2.0 μm, for example, about 2.0 μm to about 15 μm, and the thickness T2 of the third silver feature 55 is at least 3.0 μm, for example about 3.0 μm to about 30 μm.

In practice, regardless of the use of electroplating, sputtering or evaporation coating, when the thickness of a nano-twinned film is greater than 2 μm, the bonding force between the nano-twinned film and the substrate has deteriorated significantly, and the nano-twinned film can be peeled off easily. In the present disclosure, the adhesive layer 12 is formed on the substrate before the nano-twinned film is formed, which can help ensure that the nano-twinned film is thicker than 10 μm, as well as ensuring a good bonding force between the nano-twinned film and the substrate.

In addition, a nano-twinned film less than 2 μm in thickness will quickly and completely react with the bonding material during subsequent low-temperature and low-pressure wafer bonding and 3D-IC flip-chip assembly. An intermetallic compound formed at the interface is unable to bond to the substrate, which may result in peeling. In other words, it is not suitable for use in practical applications.

In some embodiments, the bonding of the first silver feature 50 and the second silver feature 50' may be performed at a temperature of 100° C. to 250° C. (for example, about 100° C. to about 150° C. or about 120° C. to about 180° C.) and under a pressure of 5 MPa to 30 MPa (for example, about 5 MPa to about 10 MPa or about 15 MPa to about 20 MPa). After the bonding of the first silver feature 50 and the second silver feature 50', the bonding structure 100 still includes the nano-twinned structures 14, 14' and retains the characteristics of the nano-twinned structure. The process of the present disclosure is performed at a pressure of 5 MPa to 30 MPa, which does not damage the substrate or silver nano twins. Although the bonding process can be performed at the low pressure of 0.8 MPa to 3 MPa in the prior art, it is necessary to perform chemical mechanical polishing (CMP) on the nano-twinned film before bonding to reduce the surface roughness. It not only complicates the process but also has potential risk to damage the nano-twinned film. Compared with the prior art, the present disclosure applies a greater pressure of about 5 MPa to about 30 MPa without damaging the substrate and the silver nano twins so that protrusions on the surface of the silver nano twins may undergo a nano-scale shaping to achieve the effect of close contact with the target. It not only solves the problem of surface roughness of silver nano twins, but also eliminates the need for additional chemical mechanical polishing or other surface treatment in the prior art, which can substantially increase throughput and yield. In addition, the hardness of the copper nano twins in the prior art is 4 GPa, which is about twice the hardness of the silver nano twins in the present disclosure. If the nano-scale protrusions shaping mechanism of the present disclosure is applied to solve the problem of surface roughness of copper nano twins, it will be necessary to apply a pressure of more than 100 MPa, which will damage the substrate and the copper nano-twinned structure.

In addition, the resistivity of silver is 1.63 μΩ·cm, which is lower than that of copper (1.69 μΩ·cm), gold (2.2 μΩ·cm), and nickel (6.90 μΩ·cm). The stacking fault energy of silver is 25 mJ/m$^2$, which is also lower than that of copper (70 mJ/m$^2$), gold (45 mJ/m$^2$), and nickel (225 mJ/m$^2$). Therefore, silver is more likely to form twins than copper, gold and nickel. Compared to the conventional technique for forming a copper nano-twinned thin film by electroplating, the diffusion rate of silver is more than 10 times faster than that of copper in the sputtering process for forming nano-twinned structure of present disclosure. The melting point of silver is about 100° C. lower than that of copper. Therefore, subsequent wafer bonding processes can be performed at a lower temperature. Compared with the prior art, the bonding process of the present disclosure can be performed at a lower temperature, so that the semiconductor device is not affected by high temperature of the bonding process. In particular, compared with the silver nano-twinned structure, the copper nano-twinned structure requires a higher temperature (for example, higher than 200° C.) for bonding. The higher temperature may damage the semiconductor device, and the small contact alignment may be failed due to the shrinkage of the material when the material is cooled to room temperature after the bonding process.

The hardness of silver nano twins is only about 2 GPa, which is softer than copper nano twins so that the surface roughness has little effect on the bonding process.

Furthermore, compared with copper nano-twinned films, silver nano-twinned films are less susceptible to oxidation, and a better bonding interface can be obtained. All of the characteristics described above show that the silver nano-twinned structure of present disclosure has the advantage of being suitable for practical application, especially for the needs of the semiconductor industry such as low-temperature and low-pressure wafer bonding and 3D-IC flip chip assembly.

The formation of twins is due to the accumulated strain energy inside a material. The strain energy drives uniform atomic shear to unsheared atoms at some regions inside the grain to form lattice positions that are mirror-symmetrical to each other. Twins include annealing twins and mechanical twins. The mutually symmetrical interface is the twin boundary.

Twins are mainly formed in face centered cubic (FCC) or hexagonal closed-packed (HCP) crystalline materials with the closest lattice arrangement. In addition to the crystal structure with the closest lattice arrangement, twins are more likely formed in materials with small stacking fault energy. For example, aluminum is a FCC crystal material, but its stacking fault energy is about 200 erg/cm$^2$. Therefore, twins are rarely formed in aluminum.

Twin boundaries are coherent crystal structures and are classified as Σ3 and n special grain boundaries with low interfacial energy. The crystal orientations are all {111}. Compared with high-angle grain boundaries formed by general annealing and recrystallization, the interfacial energy of twin boundaries is about 5% of the interfacial energy of high-angle grain boundaries (George E. Dieter, Mechanical Metallurgy, McGRAW-HILL Book Company, 1976, P. 135-141).

Due to the low interfacial energy of the twin boundaries, oxidation, sulfurization, and chloride ion corrosion may be avoided. Therefore, the silver nano-twinned thin film exhibits better resistance to oxidation and corrosion. In addition, the symmetrical lattice arrangement of twins is less likely to impede electron transportation. Therefore, the silver nano-twinned thin film exhibits better electrical and thermal conductivity. Because the twin boundaries inhibit the movement of dislocation, materials may still maintain high tensile strength. The characteristics of high tensile strength and electrical conductivity have been proven in the copper thin film. See Ultrahigh Strength and High Electrical Conductivity in Copper, Science, vol. 304, 2004, p. 422-426 issued to L. Lu, Y. Shen, X. Chen, L. Qian, and K. Lu.

In an aspect of high-temperature stability, twin boundaries are more stable than high-angle grain boundaries due to the low interfacial energy of twin boundaries. Twin boundaries are less likely to move at high temperatures. Twin boundaries may have an effect on locking surrounding high-angle grain boundaries, making the high-angle grain boundaries unable to move. Therefore, the grains may not grow significantly at high temperatures, which enable the tensile strength of the material to be maintained at high temperatures.

In an aspect of current reliability, since atoms have a low diffusion rate when passing through twin boundaries with low interfacial energy, it is difficult to move atoms inside the wire at a high current density during operation of electronic devices. As such, the electromigration that often occurs when current passes through a wire is inhibited. It has been proven that twins can inhibit electromigration in copper thin film. See Observation of Atomic Diffusion at Twin-Modified Grain Boundaries in Copper, Science, vol. 321, 2008, p. 1066-1069 issued to K. C. Chen, W. W. Wu, C. N. Liao, L. J. Chen, and K. N. Tu.

FIGS. 2A-2E illustrate cross-sectional views of a bonding structure at various fabrication stages according to other embodiments of the present disclosure. Compared with the embodiments shown in FIG. 1A-1D, the silver feature is formed on partial opposite surfaces of the two substrates in the embodiments shown in FIG. 2A-2E.

Figure 2A:
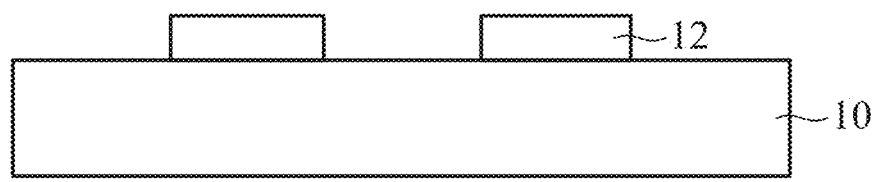
FIGS. 2A-2D are cross-sectional views of a bonding structure including a silver feature as a silver pillar at various fabrication stages according to other embodiments of the present disclosure.

Referring to FIG. 2A, the first adhesive layer 12 is formed on the partial surface of the first substrate 10. In some embodiments, the material of the first substrate 10 and the material of the first adhesive layer 12 may refer to the embodiment shown in FIG. 1A, thus is not repeated herein. It should be understood that the materials of the first substrate 10 and the first adhesive layer 12 can be appropriately adjusted according to practical applications, and are not limited thereto.

Figure 2B:
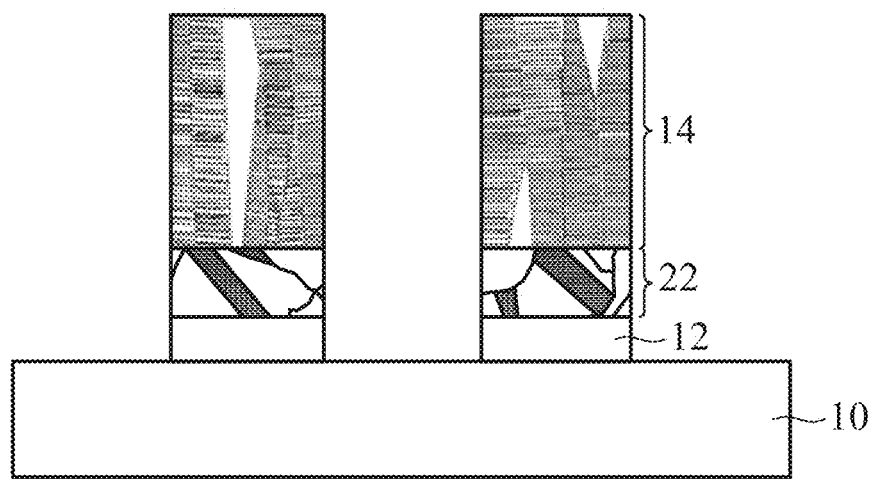

Referring to FIG. 2B, the first silver feature 50 is formed on the first adhesive layer 12. In some embodiments, the thickness of the first silver feature 50 may be 2.0 μm or more, for example, 2.0 μm to about 15 μm. The first silver feature 50 includes the silver nano-twinned structure 14. The silver nano-twinned structure 14 includes the nano-scale parallel-arranged twin boundaries (Σ3+Σ9), and the distance between the nano-scale parallel-arranged twin boundaries may be, for example, 1 nm to 100 nm, preferably 2 nm to 50 nm. In some embodiments, the silver nano-twinned structure 14 includes the parallel-stacked silver nano-twinned pillars 16. The diameters of the silver nano-twinned pillars 16 may be 0.1 μm to 10 μm, preferably 0.3 μm to μm.

Still referring to FIG. 2B, in some embodiments, in addition to the silver nano-twinned structure 14, the first silver feature also includes the transition grain layer 22. When the first silver feature 50 is initially formed on the first adhesive layer 12, instead of the silver nano-twin structure 14 with parallel-arranged twin boundaries, the transitional grain layer 22 without parallel-arranged twin boundaries will be formed first. In some embodiments, the thickness of the transition grain layer 22 may be, for example, 0.1 μm to about 1 μm.

In some embodiments, the first silver feature 50 may be formed on the first adhesive layer 12 through sputtering. In some embodiments, the sputtering process may use single sputtering gun or multiple sputtering guns. In the sputtering process, the power source may be DC, DC plus, RF, or high-power impulse magnetron sputtering (HIPIMS). The process power for sputtering the first silver feature 50 may be, for example, about 100 W to about 500 W. The sputtering process is performed at room temperature; however, the temperature during the sputtering process may rise by about 50° C. to about 200° C. The background pressure of the sputtering process may be less than $1\times10^{-5}$ torr, and the working pressure may be, for example, about $1\times10^{-3}$ torr to $1\times10^{-2}$ torr. The flow rate of argon may be about 10 sccm to about 20 sccm. The rotation speed of the stage may be, for example, about 5 rpm to about 20 rpm. During the sputtering process, a bias voltage of about −100V to about −200V is applied to the substrate. The deposition rate of the first silver feature 50 may be, for example, about 0.5 nm/s to about 3 nm/s. It should be understood that the sputtering process parameters described above may be appropriately adjusted according to practical applications, and are not intended to be limited.

In other embodiments, the first silver feature 50 may be formed on the first adhesive layer 12 through evaporation coating. In some embodiments, the background pressure of the evaporation coating process may be less than $1\times10^{-5}$ torr, and the working pressure may be, for example, about $1\times10^{-4}$ torr to $5\times10^{-4}$ torr. The flow rate of argon may be about 2 sccm to about 10 sccm. The rotation speed of the stage may be, for example, about 5 rpm to about 20 rpm. The deposition rate of the first silver feature 50 may be, for example, about 1 nm/s to about 5.0 nm/s. Additionally, an ion bombardment may be applied to the silver nano-twinned structure 14 with a voltage of about 10 V to about 300 V and a current of about 0.1 A to about 1.0 A during the evaporation coating process. It should be understood that the evaporation coating process parameters described above may be appropriately adjusted according to practical applications, and are not intended to be limited.

In some embodiments, the method for forming the first adhesive layer 12 and the first silver feature 50 on the partial surface of the first substrate 10 may include: forming the first adhesive layer 12 and the first silver feature 50 on the entire surface of the first substrate 10; and performing a patterning process to remove portions of the first adhesive layer 12 and the first silver feature 50 to form the structure as shown in FIG. 2B. In other embodiments, the method for forming the first adhesive layer 12 and the first silver feature 50 on the partial surface of the first substrate 10 may include: providing a mask with openings on the first substrate 10; forming the first adhesive layer 12 and the first silver feature 50 on the first substrate 10; and removing the mask and portions of layers outside the openings to form the structure as shown in FIG. 2B. It should be understood that the method described above is only an example and may be appropriately adjusted according to practical applications, thus is not limited thereto.

Figure 2C:
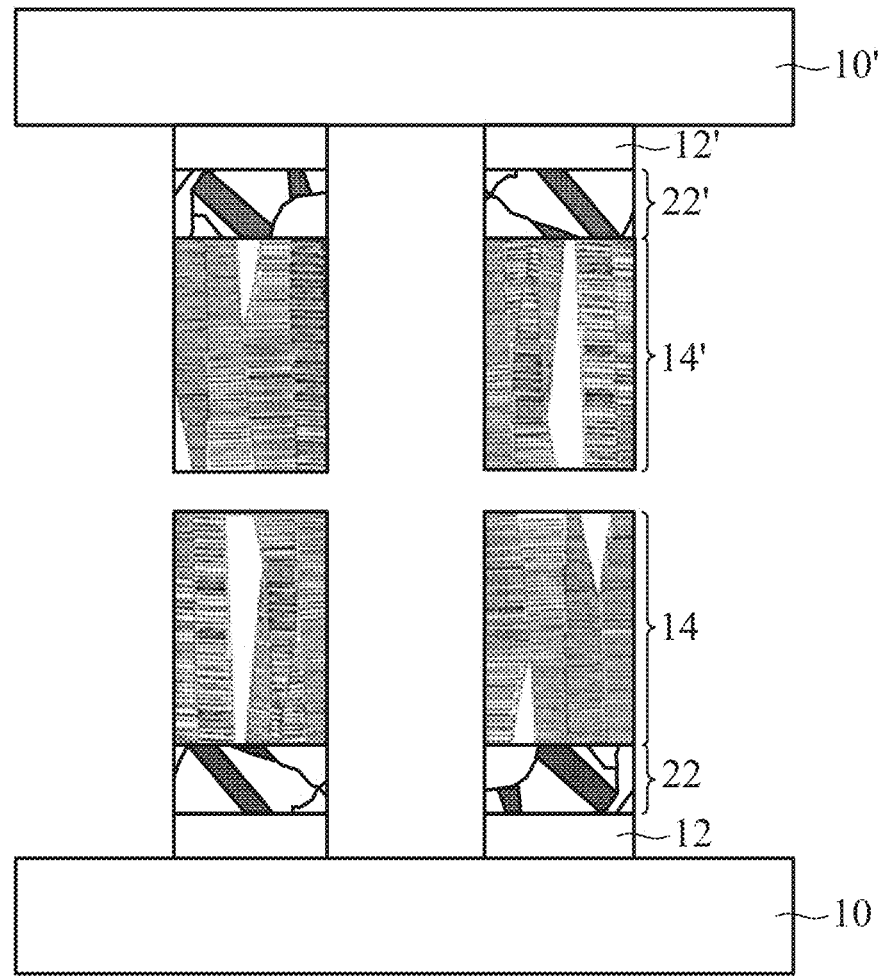

Referring to FIG. 2C, the second substrate 10' is provided, and the second adhesive layer 12' and the second silver feature 50' may be formed on the partial surface of the second substrate 10' with reference to the method described in FIGS. 2A and 2B. Subsequently, the second substrate 10' and the first substrate 10 are disposed opposite to each other for bonding.

Figure 2D:
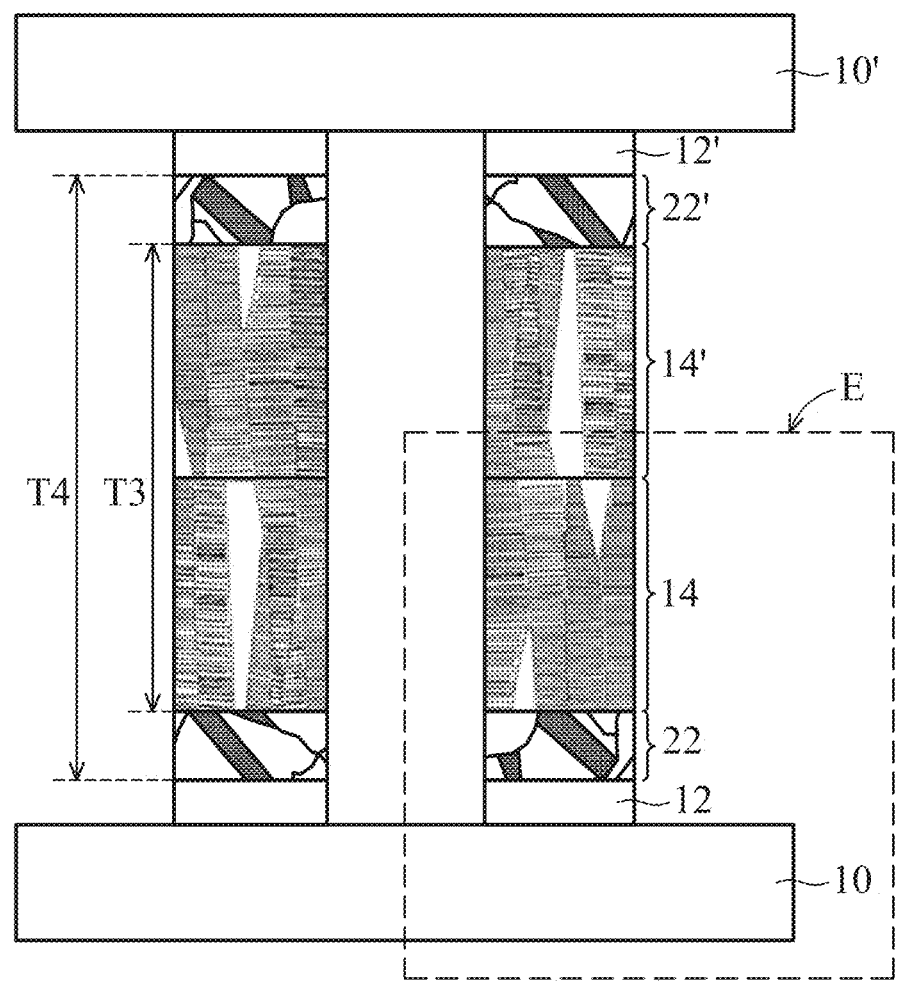

Referring to FIG. 2D, the first silver feature 50 and the second silver feature 50' are oppositely bonded to form a silver feature 55 and a bonding structure 200. In the embodiment shown in FIG. 2D, the third silver feature 55 is a silver pillar covering partial opposite surfaces of the first substrate 10 and the second substrate 10'. The sidewalls of the silver pillar are aligned with the sidewalls of the first and second adhesive layers. The third silver feature 55 has parallel-arranged twin boundaries (Σ3+Σ9). In the cross-section view of the third silver feature, 40% or more of all boundaries are the parallel-arranged twin boundaries. The parallel-arranged twin boundaries include 90% or more [111] crystal orientation, and may reach 100%. The distance between the twin boundaries may be 1 nm to 100 nm, preferably 2 nm to 50 nm. In some embodiments, at least 80% of the third silver feature 55 is the silver nano-twinned structure 14, 14'. In some embodiments, the thickness T3 of the silver nano-twinned structure 14, 14' is at least 2.0 μm, for example, about 2.0 μm to about 15 μm, and the thickness T4 of the third silver feature 55 is at least 3.0 μm, for example about 3.0 μm to about 30 μm.

In some embodiments, the bonding of the first silver feature 50 and the second silver feature 50' may be performed at a temperature of 100° C. to 250° C. and under a pressure of 5 MPa to 30 MPa (for example, about 5 MPa to about 10 MPa). After the bonding of the first silver feature 50 and the second silver feature 50', the bonding structure 200 still includes the nano-twinned structures 14, 14' and retains the characteristics of the nano-twinned structure. As shown in the embodiment in FIG. 2D, the bonding process can be performed at low temperature and low pressure in the present disclosure, so that the semiconductor device is not negatively affected by the bonding process.

Figure 2E:
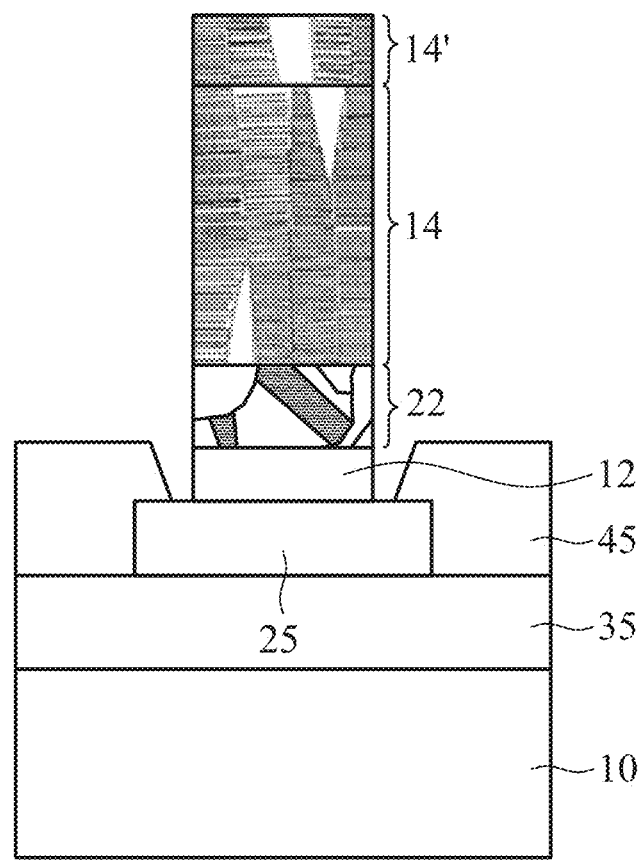
FIG. 2E is a partial enlarged view of FIG. 2D according to other embodiments of the present disclosure.

Referring to FIG. 2E, which is an enlarged schematic view of area E in FIG. 2D. In some embodiments, the first substrate 10 may include a bonding pad 25, an inter-metal dielectric 35 and a protective layer 45. In some embodiments, the bonding pad 25 may be an aluminum (Al) bonding pad. The material of the inter-metal dielectric (IMD) 35 may be silicon oxide, silicon nitride, borosilicate glass (BSG), phosphoric silicate glass (PSG), borophosphosilicate glass (BPSG), low-k materials, other suitable dielectric materials or a combination thereof. For example, an interconnection structure, a redistribution layer (RDL) (not shown), etc. may be disposed on the IMD 35. The protective layer 45 may be silicon nitride, polyimide (PI), or a combination thereof. In addition, the first substrate 10 may include various passive and active devices (not shown), such as resistors, capacitors, inductors, diodes, field effect transistors (FETs), metal-oxide semiconductor FETs (MOSFETs), complementary metal-oxide semiconductor (CMOS) transistors, bipolar junction transistors (BJTs), laterally diffused MOS (LDMOS) transistors, high-voltage transistors, high-frequency transistors, other suitable devices, or a combination thereof. It should be understood that the structure shown in FIG. 2E is only an example, and the first substrate 10 and/or the second substrate 10' (not shown in FIG. 2E) may include additional features.

In the embodiments shown in FIGS. 2A-2E, the silver feature is formed on partial opposite surfaces of the two substrates. In semiconductor devices, the silver feature can be used as an electrode. Compared with a copper pillar and a solder bonding structure in the prior art, the silver feature with the twinned structure according to embodiments of the present disclosure has advantages in the low temperature and low pressure bonding process. As described above, compared with other metals (such as copper, gold, nickel, etc.), silver has lower resistivity, stacking fault energy and melting point. It is easier to form a nano-twinned structure and can be used in the low temperature and low pressure bonding process.

Figure 3:
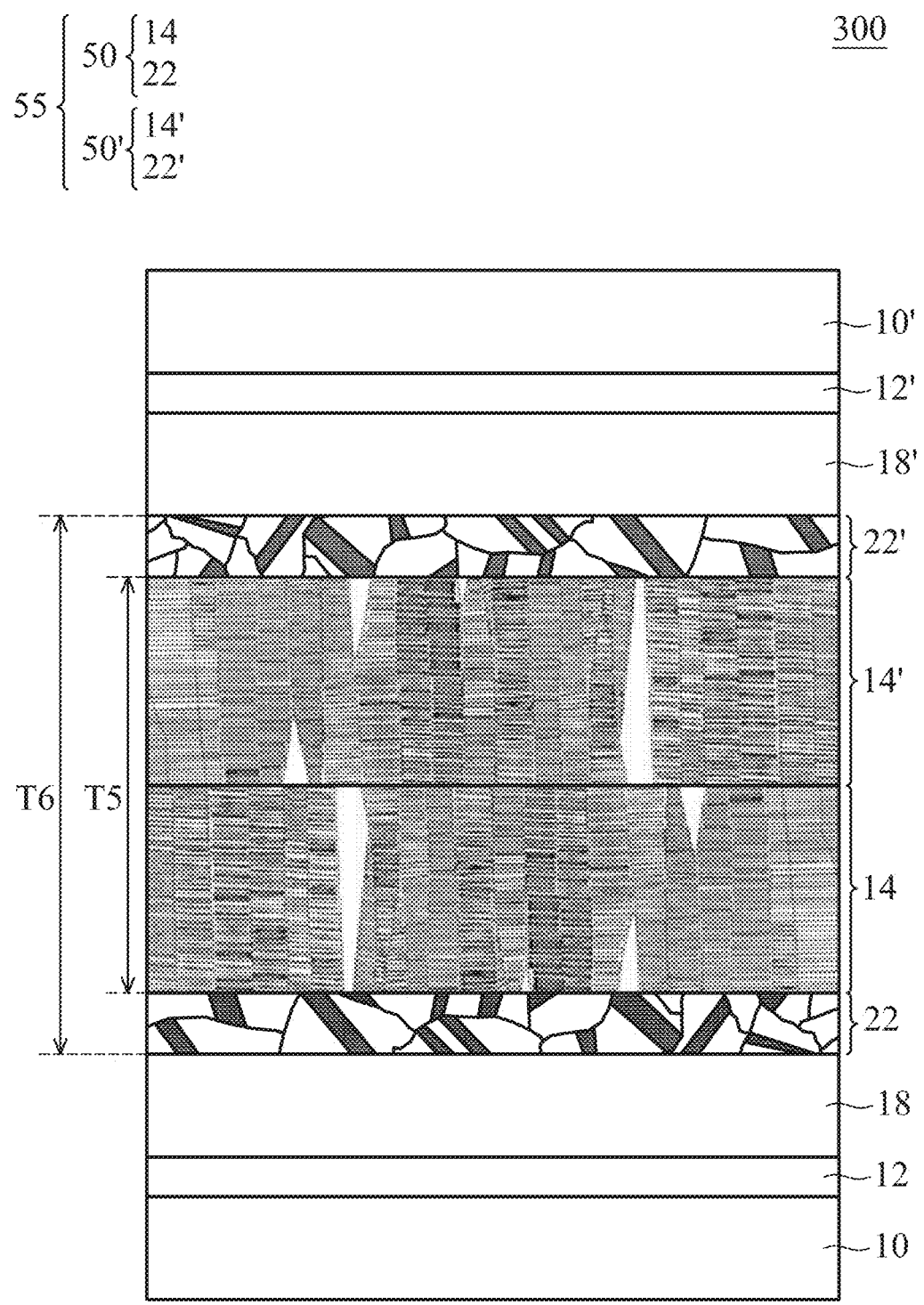
FIG. 3 is a cross-sectional view of a bonding structure including an additional diffusion barrier layer and a silver feature as a silver film according to some embodiments of the present disclosure.

FIG. 3 illustrates a cross-sectional view of a bonding structure according to some embodiments of the present disclosure. Compared with the embodiments shown in FIGS. 1A-1D, an additional diffusion barrier layer is formed between the adhesive layer and the silver feature to further enhance the bonding force between the adhesive layer and the silver feature and to avoid metal diffusion among each layer.

Referring to FIG. 3, the first adhesive layer 12 may be formed on the entire surface of the first substrate 10 with reference to the embodiment shown in FIG. 1A, thus it is not repeated herein. In this embodiment, a first diffusion barrier layer 18 may be additionally formed on the first adhesive layer 12. Similarly, a second diffusion barrier layer 18' may be formed on the second adhesive layer 12' as needed. Subsequently, the first and second silver features 50, 50' may respectively be formed on the first and second diffusion barrier layers 18, 18' with reference to the embodiments shown in FIGS. 1B-1D, and then the two substrates are bonded to form the third silver feature 55. The thicknesses T5 and T6 may refer to the thicknesses T1 and T2 shown in the embodiment in FIG. 1D.

In some embodiments, the first diffusion barrier layer 18 may include nickel (Ni). In some embodiments, the thickness of the first diffusion barrier layer 18 may be at least 0.1 μm. The diffusion barrier layer can further improve the bonding force between the adhesive layer and the subsequently formed silver feature, and prevent the subsequently formed silver feature from diffusing toward the substrate or the adhesive layer from diffusing toward the subsequently formed silver feature.

In some embodiments, the first diffusion barrier layer 18 may be formed on the first adhesive layer 12 through sputtering. The sputtering process may use single sputtering gun or multiple sputtering guns. In the sputtering process, the power source may be DC, DC plus, RF, or high-power impulse magnetron sputtering (HIPIMS).

In other embodiments, the first diffusion barrier layer 18 may be formed on the first adhesive layer 12 through evaporation coating.

Figure 4:
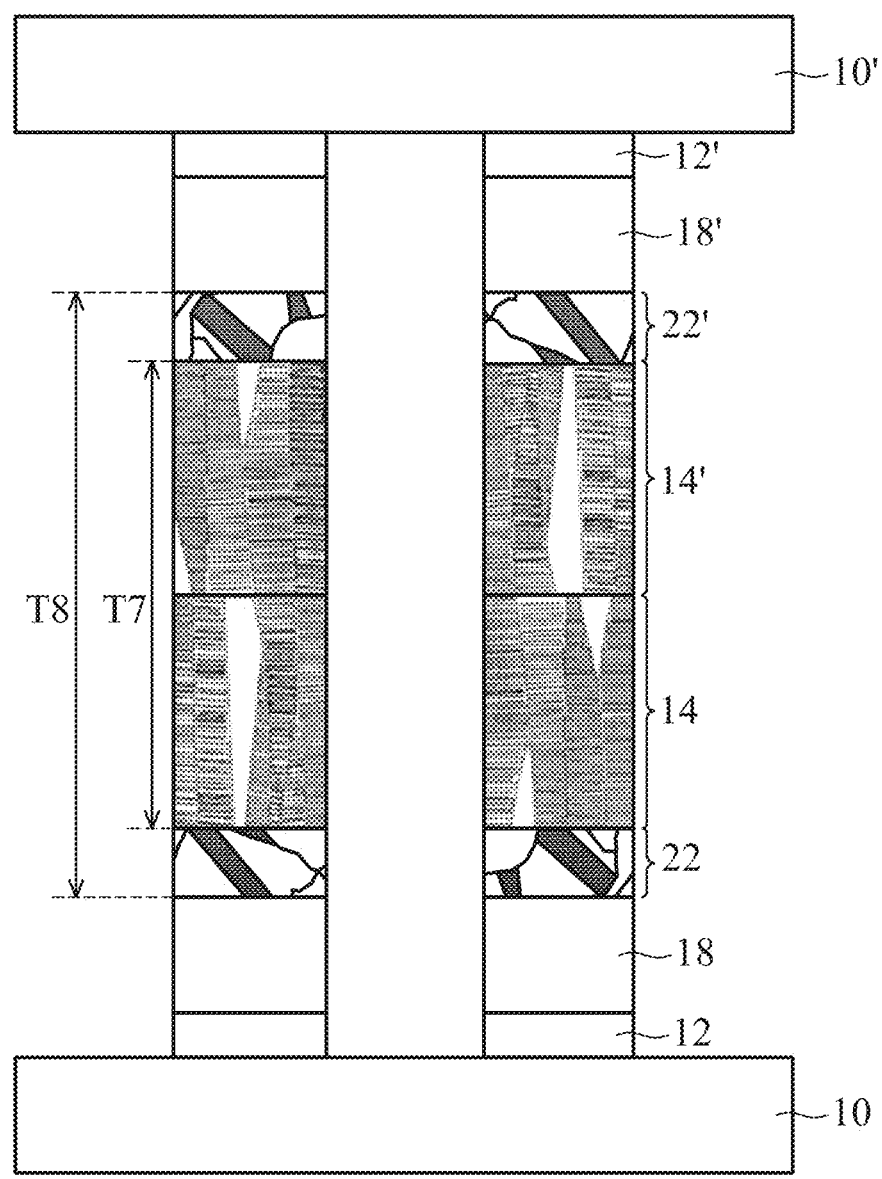
FIG. 4 is a cross-sectional view of a bonding structure including an additional diffusion barrier layer and a silver feature as a silver pillar according to other embodiments of the present disclosure.

FIG. 4 illustrates a cross-sectional view of a bonding structure according to other embodiments of the present disclosure. Compared with the embodiments shown in FIGS. 2A-2E, an additional diffusion barrier layer is formed between the adhesive layer and the silver feature to further enhance the bonding force between the adhesive layer and the silver feature and to avoid metal diffusion between layers.

Referring to FIG. 4, the first adhesive layer 12 may be formed on partial surface of the first substrate 10 with reference to the embodiment shown in FIG. 2A, thus it is not repeated herein. In this embodiment, the first diffusion barrier layer 18 may be additionally formed on the first adhesive layer 12. Similarly, the second diffusion barrier layer 18' may be formed on the second adhesive layer 12' as needed. Subsequently, the first and second silver features 50, 50' may respectively be formed on the first and second diffusion barrier layers 18, 18' with reference to the embodiments shown in FIGS. 2B-2D, and then the two substrates are bonded to form the third silver feature 55. The thicknesses T7 and T8 may refer to the thicknesses T3 and T4 shown in the embodiment in FIG. 2D. The materials and formation of the first and second diffusion barrier layers 18, 18' may refer to the embodiment shown in FIG. 3, thus it is not repeated herein. The diffusion barrier layer can further improve the bonding force between the adhesive layer and the subsequently formed silver feature, and prevent the subsequently formed silver feature from diffusing toward the substrate or the adhesive layer from diffusing toward the subsequently formed silver feature.

The embodiments of bonding two substrates described above are merely examples. It should be understood that the number of substrates may be increased to two or more, and silver features may be formed on front and back sides of various substrates for bonding.

The following describes the formation and detection results of some working examples of the present disclosure in detail.

Two titanium adhesive layers with thickness of 0.1 μm were respectively sputtered on the opposite surfaces of two (111) single crystal silicon substrates, and two silver features with thickness of 8 μm were respectively sputtered on the two titanium adhesive layers.

Figure 5:
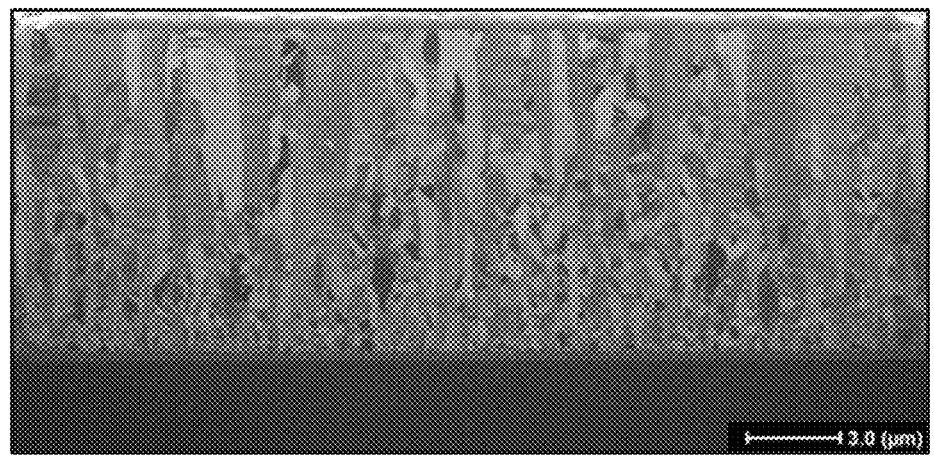
FIG. 5 is a focused ion beam (FIB) image showing a cross-sectional view of a silver nano-twinned structure on a (111) silicon substrate according to some embodiments of the present disclosure.

FIG. 5 is a focused ion beam (FIB) image showing the cross-sectional view of the substrate having the titanium adhesive layer and the silver feature before bonding. As shown in FIG. 5, a transition grain layer is between the titanium adhesive layer and the silver feature.

Figure 6:
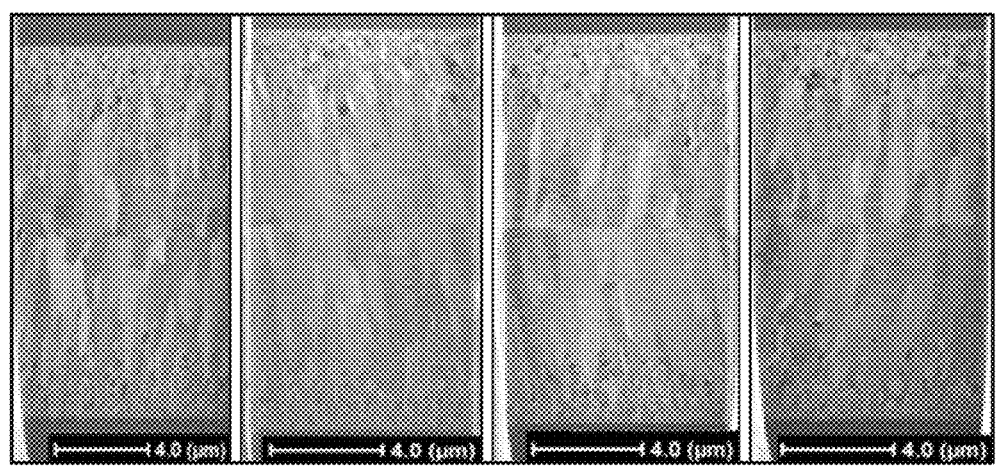
FIG. 6 is a focused ion beam image showing cross-sectional views of bonding structures formed at various temperatures according to other embodiments of the present disclosure.

Referring to FIG. 6, the two single crystal silicon substrates with the titanium adhesive layers and silver features thereon were bonded at a pressure of $10^{-3}$ torr and temperatures of 100° C., 150° C., 200° C., and 250° C., respectively. The duration of the bonding process at 100° C. is 60 minutes, and the durations of the bonding processes at 150° C., 200° C., and 250° C. are 30 minutes. From left to right, FIG. 6 illustrates cross-sectional views analyzed by FIB of the two substrates bonded at 100° C., 150° C., 200° C., and 250° C., respectively. As shown in FIG. 6, there are no holes at the bonding interface between the two substrates, and the two substrates still retain the nano-twinned structure after bonding.

Figure 7:
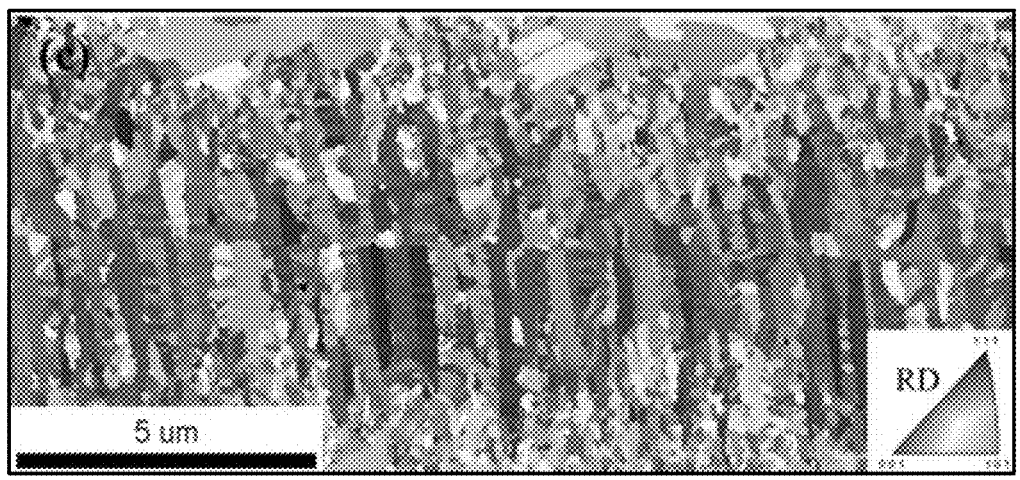
FIG. 7 is a crystal orientation image of a bonding structure analyzed by electron backscatter diffraction (EBSD) according to some embodiments of the present disclosure.

Referring to FIG. 7, two silicon wafers with titanium adhesive layers and silver features thereon were bonded at a temperature of 150° C. for 60 minutes. FIG. 7 is a crystal orientation image of the bonding interface analyzed by electron backscatter diffraction (EBSD). FIG. 7 shows that the parallel-arranged nano-twinned boundaries of the bonding structure includes more than 99.2% [111] crystal orientation, and 89.7% of the silver feature is the silver nano-twinned structure with [111] crystal orientation.

Embodiments of the present disclosure have some advantageous features. The adhesive layer disposed between the substrate and the silver nano-twin structure provides a better bonding force between the substrate and the silver nano-twin structure to avoid peeling. The adhesive layer also has the effect of lattice buffering to reduce the influence of lattice of the substrate on the growth of the silver nano-twinned structure. In the cross-sectional view of the bonding structure, the silver nano-twinned structure includes the parallel-arranged twin boundaries, and 40% or more of all boundaries are the parallel-arranged twin boundaries. At least 80% of the silver feature is the silver nano-twinned structure. Compared with other metals (such as copper, gold, nickel, etc.), silver has lower resistivity, stacking fault energy and melting point. It is easier to form a nano-twinned structure and can be used in the low temperature and low pressure bonding process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A bonding structure, comprising:
   a first substrate;
   a second substrate disposed opposite to the first substrate;
   a first adhesive layer disposed on the first substrate;
   a second adhesive layer disposed on the second substrate and opposite to the first adhesive layer; and a silver feature disposed between the first adhesive layer and the second adhesive layer, wherein the silver feature comprises a silver nano-twinned structure comprising parallel-arranged twin boundaries, wherein the parallel-arranged twin boundaries comprise 90% or more crystal orientation, wherein at least 80% of the silver feature is the silver nano-twinned structure.

2. The bonding structure as claimed in claim 1, wherein the first adhesive layer and the second adhesive layer are respectively disposed on entire opposing surfaces of the first substrate and the second substrate, and wherein the silver feature is a silver film.

3. The bonding structure as claimed in claim 1, wherein the first adhesive layer and the second adhesive layer are respectively disposed on partial opposing surfaces of the first substrate and the second substrate, and wherein the silver feature is a silver pillar and sidewalls of the silver pillar are aligned with sidewalls of the first adhesive layer and the second adhesive layer.

4. The bonding structure as claimed in claim 1, wherein a thickness of the silver feature is at least 3.0 µm.

5. The bonding structure as claimed in claim 1, wherein a thickness of the silver nano-twinned structure is at least 2.0 µm.

6. The bonding structure as claimed in claim 1, wherein a distance between the parallel-arranged twin boundaries is between 1 nm and 100 nm.

7. The bonding structure as claimed in claim 1, wherein a thickness of each of the first adhesive layer and the second adhesive layer is 0.01 µm to 0.1 µm.

8. The bonding structure as claimed in claim 1, wherein each of the first adhesive layer and the second adhesive layer comprises titanium (Ti), chromium (Cr), titanium tungsten (TiW), or a combination thereof.

9. The bonding structure as claimed in claim 1, wherein each of the first substrate and the second substrate comprises Si wafer, SiC wafer, GaAs wafer, GaN wafer, or a combination thereof.

10. The bonding structure as claimed in claim 1, further comprising: a transition grain layer between the first adhesive layer and the silver feature and/or between the second adhesive layer and the silver feature.

\* \* \* \* \*